(12) United States Patent
Xu et al.

(10) Patent No.: US 11,380,807 B2
(45) Date of Patent: Jul. 5, 2022

(54) BACK-CONTACT SOLAR CELL AND SOLAR CELL MODULE INCLUDING SAME

(71) Applicants: Jinko Green Energy (Shanghai) Management Co., LTD., Shanghai (CN); ZHEJIANG JINKO SOLAR CO., LTD., Haining (CN)

(72) Inventors: Menglei Xu, Shanghai (CN); Jie Yang, Shanghai (CN); Peiting Zheng, Shanghai (CN); Xinyu Zhang, Shanghai (CN); Hao Jin, Shanghai (CN)

(73) Assignees: Jinko Green Energy (Shanghai) Management Co., LTD., Shanghai (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 17/127,828

(22) Filed: Dec. 18, 2020

(65) Prior Publication Data
US 2022/0158010 A1     May 19, 2022

(30) Foreign Application Priority Data
Nov. 19, 2020   (CN) .......................... 202011307889.X

(51) Int. Cl.
*H01L 31/0224*     (2006.01)
*H01L 31/05*        (2014.01)

(52) U.S. Cl.
CPC .. *H01L 31/022441* (2013.01); *H01L 31/0516* (2013.01)

(58) Field of Classification Search
CPC ......... H01L 31/022441; H01L 31/0465; H01L 31/0508; H01L 31/0516
See application file for complete search history.

(56) References Cited

U.S. PATENT DOCUMENTS

| 2018/0108796 A1* | 4/2018 | Heng ................... H01L 31/0516 |
| 2019/0019909 A1* | 1/2019 | Nadimpally ........ H01L 31/0201 |
| 2019/0081198 A1* | 3/2019 | Morad .................. H01L 31/044 |

FOREIGN PATENT DOCUMENTS

| CN | 103117313 A | 5/2013 |
| CN | 203434165 U | 2/2014 |

(Continued)

OTHER PUBLICATIONS

Machine translation of EP-3598506-A1, Gerritsen Eric. (Year: 2020).*

(Continued)

*Primary Examiner* — Mayla Gonzalez Ramos
(74) *Attorney, Agent, or Firm* — USCH Law, PC

(57) ABSTRACT

The present disclosure provides a back-contact solar cell and a solar cell module. The back-contact solar cell includes: a substrate including a light-receiving surface and a back surface opposite to the light-receiving surface, wherein the substrate includes a center region and connecting regions on opposite sides of the center region; positive electrodes and negative electrodes disposed on the back surface of the substrate; auxiliary positive electrodes, disposed on one or both of the light-receiving surface and a side surface of each of the connecting regions, and configured to be electrically coupled to the plurality of positive electrodes; and auxiliary negative electrodes, disposed on one or both of the light-receiving surface and the side surface of each of the connecting regions, and configured to be electrically coupled to the plurality of negative electrodes.

20 Claims, 9 Drawing Sheets

(56) References Cited

FOREIGN PATENT DOCUMENTS

| | | | |
|---|---|---|---|
| CN | 109216475 A | 1/2019 | |
| CN | 110323300 A | 10/2019 | |
| EP | 3598506 A1 * | 1/2020 | ........... H01L 31/042 |
| EP | 3598506 A1 | 1/2020 | |
| KR | 20150084509 A | 7/2015 | |
| WO | 2011090169 A1 | 7/2011 | |

OTHER PUBLICATIONS

Jinko Green Energy (Shanghai) Management Co., Ltd. et al., Extended European Search Report, EP20215555.2, dated May 14, 2021, 7 pgs.

Jinko Green Energy (Shanghai) Management Co., LTD. et al., Notice of acceptance for your patent application, AU 2020289882, dated Aug. 12, 2021, 4 pgs.

Jinko Green Energy (Shanghai) Management Co., Ltd., CN First Office Action with English Translation, CN 202011307889.X, dated Dec. 14, 2021, 21 pgs.

* cited by examiner

BACK-CONTACT SOLAR CELL AND SOLAR CELL MODULE INCLUDING SAME

CROSS REFERENCE TO RELATED APPLICATIONS

This present application claims the benefit of priority under the Paris Convention to Chinese Patent Application No. 202011307889.X filed on Nov. 19, 2020, which is incorporated herein by reference in its entirety.

TECHNICAL FIELD

The present disclosure relates to the field of photovoltaic technology, and in particular to a back-contact solar cell and a solar cell module.

BACKGROUND

A solar cell is a semiconductor device with a semiconductor substrate. The solar cell is capable of energy conversion and used for photovoltaic power generation. In recent years, photovoltaic power generation technology, as a mainstream technology for utilizing solar energy resources, is an important means for green energy development and has been marketed and commercialized. More output power has become a trend for solar cell products.

A back-contact solar cell, as a kind of high-efficiency solar cell, has been paid much attention. For a conventional back-contact solar cell, there is no bus bar on its light-receiving surface, and there is not even any electrode (e.g., metal grids) pattern. A plurality of positive electrodes and a plurality of negative electrodes are arranged on a back surface of the solar cell. Thus, compared with the non-back-contact solar cell, light blocking caused by the electrode pattern can be reduced, which may bring an increased light-receiving area on the light-receiving surface and improved energy conversion efficiency.

In a shingled solar cell module, it is expensive and complex to utilize the conventional back-contact solar cells to solar cell strings therein. Its manufacture process has low compatibility compared with the manufacture process of existing shingled solar cell module. Therefore, it is desirable to develop a novel back-contact solar cell easy to form the solar cell module with a large light-receiving area (e.g., in the shingled manner).

SUMMARY

Some embodiments of the present disclosure provide a back-contact solar cell and a solar cell module. The back-contact solar cell structure provided herein can facilitate forming the solar cell module with a large light-receiving area.

Some embodiments provide a back-contact solar cell including: a substrate including a light-receiving surface and a back surface opposite to the light-receiving surface; wherein the substrate is divided to a center region and connecting regions on opposite sides of the center region; a plurality of positive electrodes and a plurality of negative electrodes disposed on the back surface of the substrate; a plurality of auxiliary positive electrodes, disposed on one or both of the light-receiving surface and a side surface of each of the connecting regions, and configured to be electrically connected to the plurality of positive electrodes, wherein an individual auxiliary positive electrodes is electrically coupled to one of the plurality of positive electrodes; and a plurality of auxiliary negative electrodes, disposed on one or both of the light-receiving surface and the side surface of each of the connecting regions, and configured to be electrically coupled to the plurality of negative electrodes, wherein an individual auxiliary negative electrodes is electrically coupled to one of the plurality of negative electrodes.

In some embodiments, the plurality of auxiliary positive electrodes and the plurality of auxiliary negative electrodes are disposed on the light-receiving surface of each of the connecting regions, the back-contact solar cell further comprises: a plurality of through-holes including first through-holes and second through-holes in the connecting regions; a first filling electrode, in each of the first through-holes, configured to electrically connect an individual positive electrode on the back surface and an individual auxiliary positive electrodes on the light-receiving surface, respectively; a second filling electrode, in each of the second through-holes, configured to electrically connect an individual negative electrode on the back surface and an individual auxiliary negative electrodes on the light-receiving surface, respectively.

In some embodiments, the plurality of through-holes are formed at an edge of the substrate.

In some embodiments, each of the connecting regions has a width of 0.1 mm-3 mm in a direction parallel to an extension direction of the plurality of positive electrodes and the plurality of negative electrodes.

In some embodiments, the plurality of through-holes are formed in the connecting regions and have a distance of 0.2 mm-2.5 mm to a side surface of a corresponding connecting region.

In some embodiments, each of the plurality of through-holes is circle-shaped, elliptic circle-shaped or square circle-shaped.

In some embodiments, each of the plurality of through-holes is formed through laser drilling.

In some embodiments, the plurality of auxiliary positive electrodes and the plurality of auxiliary negative electrodes extend from one side to an other side of each of the connecting regions on the receiving surface respectively, in a direction parallel to an extension direction of the plurality of positive electrodes and the plurality of negative electrodes.

In some embodiments, the plurality of auxiliary positive electrodes and the plurality of auxiliary negative electrodes are disposed on both of the light-receiving surface and the side surface of each of the connecting regions, and each of the connecting regions has a width of 0.1 mm-3 mm in a direction parallel to an extension direction of the plurality of positive electrodes and the plurality of negative electrodes.

In some embodiments, the plurality of auxiliary positive electrode and the plurality of auxiliary negative electrode extend from the light-receiving surface to the side surface of each of the connecting regions.

In some embodiments, the plurality of auxiliary positive electrodes and the plurality of auxiliary negative electrodes are disposed on the side surface of each of the connecting regions; a first portion of an individual auxiliary positive electrode is disposed on the side surface of an individual connecting region and a second portion of the individual auxiliary positive electrode is configured to electrically connect to the first portion of the individual auxiliary positive electrode and an individual positive electrode; a first portion of an individual auxiliary negative electrode is disposed on the side surface of an individual connecting region and a second portion of the individual auxiliary negative electrode is configured to electrically connect to the first portion of the individual auxiliary negative electrode and an individual negative electrode.

In some embodiments, an extension direction of the plurality of auxiliary positive electrodes on the light-receiving surface, an extension direction of the plurality of auxiliary negative electrodes on the light-receiving surface, an extension direction of the plurality of positive electrodes on the back surface and an extension direction of the plurality of negative electrodes on the back surface are parallel.

In some embodiments, the plurality of auxiliary positive electrodes and the plurality of auxiliary negative electrodes are arranged alternately, and are prepared by printing and drying a plurality of positive electrode pastes and a plurality of negative electrode pastes, respectively.

Some embodiments further provide a solar cell module, including a plurality of first back-contact solar cells and a plurality of second back-contact solar cells; wherein each of the plurality of first back-contact solar cells comprises: a substrate including a light-receiving surface and a back surface opposite to the light-receiving surface; wherein the substrate is divided to a center region and connecting regions on opposite sides of the center region; a plurality of positive electrodes and a plurality of negative electrodes disposed on the back surface of the substrate; a plurality of auxiliary positive electrodes, disposed on the light-receiving surface or disposed on both the light-receiving surface and a side surface of each of the connecting regions, and configured to be electrically coupled to the plurality of positive electrodes, wherein an individual auxiliary positive electrodes is electrically coupled to one of the plurality of positive electrodes; and a plurality of auxiliary negative electrodes, disposed on the light-receiving surface or disposed on both the light-receiving surface and the side surface of each of the connecting regions, and configured to be electrically coupled to the plurality of negative electrodes, wherein an individual auxiliary negative electrodes is electrically coupled to one of the plurality of negative electrodes; wherein each of the plurality of second back-contact solar cells comprises: a plurality of positive electrodes and a plurality of negative electrodes disposed on a back surface of a substrate and no electrodes disposed on a light-receiving surface of the substrate; wherein at least one of connecting regions of an individual first back-contact solar cell is overlapped with a part of an individual second back-contact solar cell for electrical connection; and the plurality of first back-contact solar cells are spaced apart, the plurality of positive electrodes of each second back-contact solar cell are electrically coupled to the plurality of auxiliary positive electrodes of an adjacent first back-contact solar cell respectively; and the plurality of negative electrodes of each second back-contact solar cell are electrically coupled to the plurality of auxiliary negative electrodes of an adjacent first back-contact solar cell.

In some embodiments, an overlapped region is coated with an adhesive, for the plurality of auxiliary positive electrodes, the plurality of auxiliary negative electrodes, the plurality of positive electrodes and the plurality of negative electrodes in the overlapped region to be operably connected together.

In some embodiments, the plurality of auxiliary positive electrodes, the plurality of auxiliary negative electrodes, the plurality of positive electrodes and the plurality of negative electrodes in the overlapped region are operably connected together by a sintering process with a sintering temperature of 500° C.~800° C.

In some embodiments, the adhesive at least comprises one of a conductive adhesive, $SiO_2$, $B_2O_3$, $Bi_2O_3$ and ZnO.

Some embodiments further provide a solar cell module, comprising a plurality of back-contact solar cells, wherein each of the plurality of back-contact solar cells comprises: a substrate including a light-receiving surface and a back surface opposite to the light-receiving surface; wherein the substrate is divided to a center region and connecting regions on opposite sides of the center region; a plurality of positive electrodes and a plurality of negative electrodes disposed on the back surface of the substrate; a plurality of auxiliary positive electrodes, disposed on a side surface of each of the connecting regions, and configured to be electrically coupled to the plurality of positive electrodes, wherein an individual auxiliary positive electrodes is electrically coupled to one of the plurality of positive electrodes; and a plurality of auxiliary negative electrodes, disposed on the side surface of each of the connecting regions, and configured to be electrically coupled to the plurality of negative electrodes, wherein an individual auxiliary negative electrodes is electrically coupled to one of the plurality of negative electrodes; the plurality of back-contact solar cells are arranged successively, side surfaces of connecting regions of adjacent back-contact solar cells are attached together; the plurality of auxiliary positive electrodes of the adjacent back-contact solar cells are electrically connected, and the plurality of negative electrodes of the adjacent back-contact solar cells are electrically connected.

In some embodiments, the side surfaces of connecting regions of adjacent back-contact solar cells are attached by an adhesive.

In some embodiments, the adhesive at least comprises one of a conductive adhesive, $SiO_2$, $B_2O_3$, $Bi_2O_3$ and ZnO.

Some embodiments further provide a solar cell module, comprising a plurality of back-contact solar cells according to any one of the above solar cells and a plurality of non-back-contact solar cells; wherein each of the non-back-contact solar cell comprises a plurality of positive electrodes and a plurality of negative electrodes; each auxiliary positive electrode of each back-contact solar cell and each positive electrode of an adjacent non-back-contact solar cell are electrically connected through a first conductive structure; and each auxiliary negative electrode of each back-contact solar cell and each negative electrode of the adjacent non-back-contact solar cell are electrically connected through a second conductive structure.

In some embodiments, the first conductive structure and the second conductive structure are a conductive wire or a welding ribbon.

BRIEF DESCRIPTION OF THE DRAWINGS

One or more embodiments are described as examples with reference to the corresponding figures in the accompanying drawings that do not constitute a proportion limitation unless otherwise stated.

DETAILED DESCRIPTION

Embodiments of the present disclosure will be described in detail below with reference to the accompanying drawings in order to make the objectives, technical solutions and advantages of the present disclosure clearer. However, it will be apparent to those skilled in the art that, in the various embodiments of the present disclosure, numerous technical details are set forth in order to provide a reader with a better understanding of the present disclosure. However, the technical solutions claimed in the present disclosure can be implemented without these technical details and various changes and modifications based on the following embodiments. Classification of the following embodiments is to facilitate description, but shall not constitute any limitation to a particular implementation of the present disclosure. The embodiments may be combined or refer to each other if there is no contradiction.

A process of arranging conventional back-contact solar cells into a cell string in a shingled manner is complex and low in compatibility. Therefore, it remains a problem as to how to simplify the process to arrange the back-contact solar cells in a shingled manner, so that a low cost may be used to enable a back-contact solar cell module to acquire a maximum light-receiving area.

In order to address the above issue, some embodiments of the present disclosure provide a back-contact solar cell with auxiliary electrodes, and the back-contact solar cell includes: a substrate including a light-receiving surface facing the sun and a back surface opposite to the light-receiving surface; positive electrodes and negative electrodes both formed at the back surface of the substrate. The substrate includes a center region and a connecting region located at two opposite sides of the center region in a direction perpendicular to a thickness direction of the substrate. That is, the center region includes a center portion of the substrate; each of the connecting regions includes a corresponding edge portion of the light-receiving surface and a side surface perpendicular to the light-receiving surface. The back-contact solar cell further includes auxiliary positive electrodes formed at a light-receiving surface and/or a side surface of the connecting region and electrically coupled to the positive electrodes respectively; and auxiliary negative electrodes formed at a light-receiving surface and/or the side surface of the connecting region and electrically coupled to the negative electrodes respectively.

Figure 1:
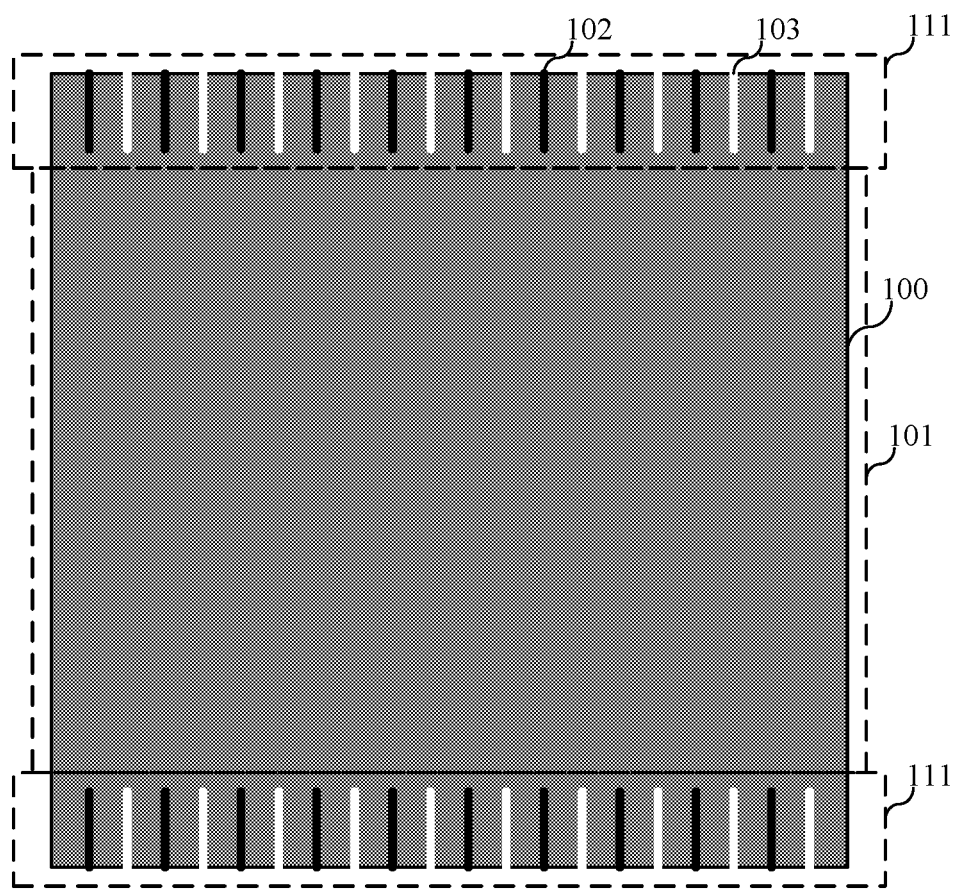
FIGS. 1 to 3 are schematic diagrams of structures of a back-contact solar cell with auxiliary electrodes according to the present disclosure.
Figure 2:
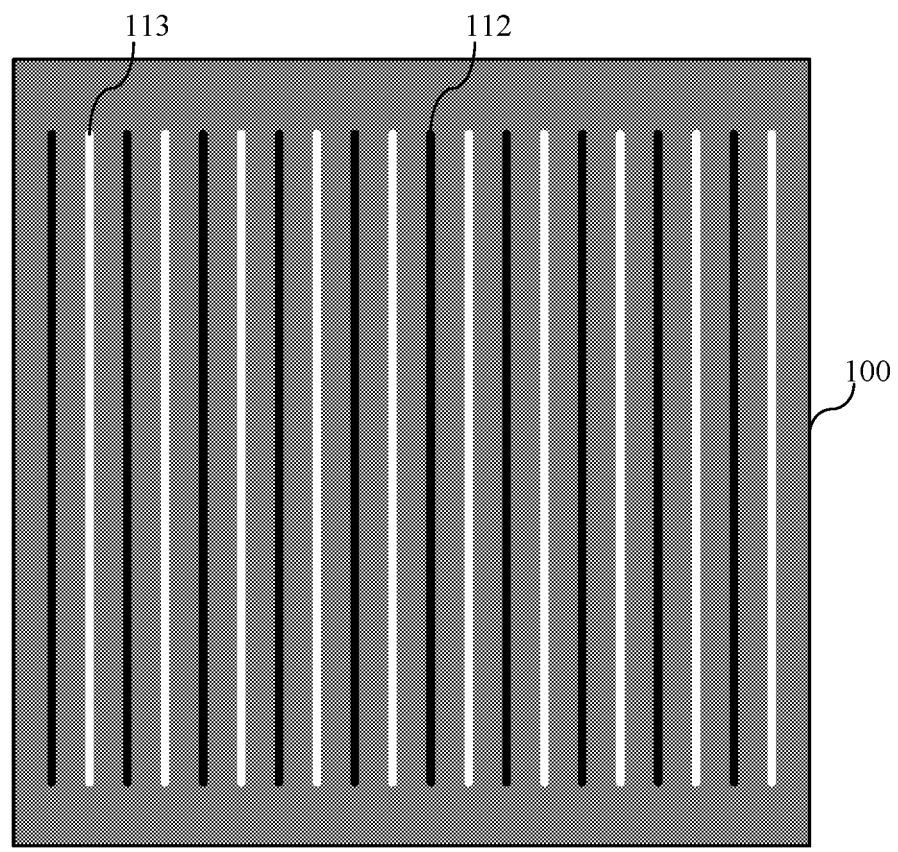
Figure 3:
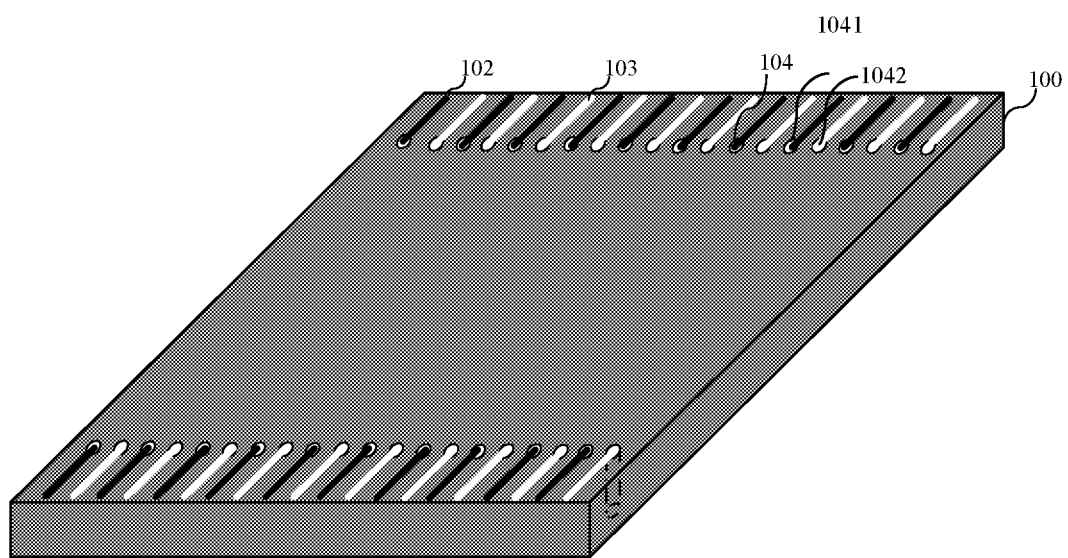

FIGS. 1 to 3 are schematic diagrams of structures of a back-contact solar cell with auxiliary electrodes provided in this embodiment. In the following, the back-contact solar cell with the auxiliary electrodes provided in this embodiment will be described in detail with reference to the drawings.

With reference to FIGS. 1 to 3, a back-contact solar cell 100 with auxiliary electrodes includes: a substrate including a light-receiving surface facing the sun and a back surface opposite to the light-receiving surface.

In particular, the substrate at least includes a substrate having an emitter, a passivation layer and/or an anti-reflection layer disposed on a surface of the substrate. The substrate having the emitter is used to receive light radiation and generate photon-generated carriers. The passivation layer includes an interface passivation layer and/or a field passivation layer. The interaface pasiviation layer is used to realize an interface passivation effect, i.e., to reduce a recombination rate of majority carriers and minority carriers. The field passivation layer is used to realize a field passivation effect, i.e., to realize selective transmission of the majority carriers to ensure effective transmission of the majority carriers. The anti-reflection layer is used to reduce reflection of light and increase a light transmission rate, thereby increasing light radiation received by the substrate.

For the back-contact solar cell, a common passivation layer structure may be a tunnel oxide layer, a polysilicon-doped layer (a polysilicon-doped layer of a P type and an N type arranged alternately) or a silicon-nitride-with-hydrogen layer and the like. An electrical connection is formed between a P-type polysilicon layer and a positive electrode on a back surface of the substrate, and an electrical connection is formed between an N-type polysilicon layer and a negative electrode on the back surface of the substrate.

FIG. 1 shows a structure of a light-receiving surface of the back-contact solar cell 100 with the auxiliary electrodes, and FIG. 2 shows a structure of a back surface of the back-contact solar cell 100 with the auxiliary electrodes.

In a direction perpendicular to a thickness direction of the substrate, the substrate includes a center region 101 and connecting regions 111 located at opposite sides of the center region 101.

In this embodiment, the substrate is divided into the center region 101 and the connecting regions 111. The center region 101 refers to a center region to generate photon-generated carriers, for example, a central zone of the substrate. Generally, the light-receiving surface in the center region 101 does not include a metal grid to prevent an incident light. The connecting regions 111 may refer to a region outside the center region 101, for example, two edges of the substrate. In this embodiment, a light-receiving surface of the connecting region 111 is provided with metal grids of auxiliary positive electrodes 102 and auxiliary negative electrodes 103.

It shall be noted that the connecting regions 111 may also receive incident light on a surface of the connecting region 111 to generate photon-generated carriers. However, because of shielding by the metal grids, there will be a certain loss in light use, causing a negative impact on light conversion efficiency. In one example, for a solar cell module formed with overlapped back-contact solar cells 100 with the auxiliary electrodes, at least a part of the connecting regions 111 will be in an overlapped region of adjacent cells in the solar cell module.

In this embodiment, each of the connecting regions 111 is a region with a width of 0.1 mm-3 mm, for example, 0.5 mm, 1.0 mm, 1.5 mm, 2.0 mm or 2.5 mm, formed at both sides of the center region 101. If a width of the connecting region 111 is too large, a light-receiving area of a solar cell module formed by overlapped cells will be reduced. If the width of the connecting region 111 is too small, stability of the solar cell module formed by the overlapped cells will be reduced.

Positive electrodes 112 are disposed on the back surface of the substrate. Negative electrodes 113 are disposed on the back surface of the substrate. The positive electrodes 112 and the negative electrodes 113 are arranged alternately. In one example, positive electrode pastes and negative electrode pastes are printed on the back surface of the solar cell, and are dried to form the positive electrodes 112 and the negative electrodes 113 respectively.

In this embodiment, the auxiliary positive electrodes 102 are disposed on the light-receiving surface of the connecting region 111, and are electrically coupled (e.g., electrically connected) to the positive electrodes 112 respectively; the auxiliary negative electrodes 103 are disposed on the light-receiving surface of the connecting region 111, and are electrically coupled to the negative electrodes 113 respectively. The auxiliary positive electrodes 102 and the auxiliary negative electrodes 103 are arranged alternately. In one example, positive electrode pastes and negative electrode pastes are printed on the light-receiving surface of the connecting region 111 of the solar cell, and are dried to form the auxiliary positive electrodes 102 and the auxiliary negative electrodes 103 respectively.

The auxiliary positive electrode 102 is used to extend the positive electrode 112 from the back surface to the light-receiving surface of the connecting region 111, and the auxiliary negative electrode 103 is used to extend the negative electrode 113 from the back surface to the light-receiving surface of the connecting region 111. By extending a metal grid line of the back-contact solar cell to the light-receiving surface, the formed solar cell may be compatible for a highly-efficiency module with shingled cells/stitch welding technology. In addition, by extending the metal grid line to the light-receiving surface, no extra shading loss is caused, thereby a high output power of the back-contact solar cell is guaranteed.

In particular, in a width direction of the connecting region 111, the auxiliary positive electrodes 102 and the auxiliary negative electrodes 103 extend from one side of the connecting region 111 to the other side of the connecting region 111.

In this embodiment, the back-contact solar cell 100 with the auxiliary electrodes further includes through-holes 104 formed in each of the connecting regions 111 and through the connecting region 111 in a thickness direction of the connecting region 111. The auxiliary positive electrode 102 is electrically connected to the positive electrode 112 at the back surface through a through-hole 104. The auxiliary negative electrode 103 is electrically connected to the positive electrodes 112 at the back surface through an other through-hole 104. In one example, the positive electrode pastes and the negative electrode pastes printed on the light-receiving surface of the connecting region 111 of the solar cell are further used to fill through-holes 104, so that the auxiliary positive electrodes 102 are electrically connected to the positive electrodes 112 through the through-holes 104 and the auxiliary negative electrodes 103 are electrically connected to the negative electrodes 113 through the other through-holes 104 respectively.

In particular, a plurality of through-holes 104 are formed in the connecting regions 111 of the back-contact solar cell 100 with the auxiliary electrodes, the through-holes go through the connecting regions 111 in the thickness direction of the connecting regions 111.

In one example, a shape of the through-hole 104 may be a circle, an ellipse or a square. In this embodiment, a circular through-hole 104 is taken as an example for illustration, which does not form a limitation to this embodiment. Further, the through-hole 104 is formed through laser drilling to improve accuracy of processing of the through-hole 104.

In addition, in this embodiment, the plurality of through-holes 104 are formed at an edge of the substrate. For example, the plurality of through-holes 104 are located 0.2 mm to 2.5 mm, for example, 0.4 mm, 0.8 mm, 1.2 mm, 1.6 mm, 2.0 mm or 2.4 mm, from a side of the substrate. Based on the position of the plurality of through-holes 104, a length of the auxiliary positive electrodes 102 and the auxiliary negative electrodes 103 on the light-receiving surface of the connecting region 111 is increased, so as to ensure stability of a solar cell module formed later.

It shall be noted that in another embodiment, filling electrodes are included to fill the through-holes. A filling electrode is electrically connected to the positive electrode or the negative electrode at the back surface of the solar cell. An auxiliary positive electrode is electronically connected to the filling electrode at the light-receiving surface. An auxiliary negative electrode is electronically connected to other filling electrode at the light-receiving surface. One filling electrode is electrically connected to only one auxiliary positive electrode or only one auxiliary negative electrode. In other words, the plurality of through-holes includes a first through-hole 1041 and a second through-hole 1042 in the connecting regions; a first filling electrode is in the first through-hole 1041 of the plurality of through-holes, the first filling electrode is electrically connected to the positive electrodes on the back surface; a second filling electrode is in the second through-hole 1042 of the plurality of through-holes, the second filling electrode is electrically connected to the negative electrodes on the back surface; the auxiliary positive electrode on the light-receiving surface is electrically connected to the first filling electrode, the auxiliary negative electrode on the light-receiving surface is electrically connected to the second filling electrode. In one example, electrode paste is filled in the through-hole and dried to form a filling electrode.

In addition, in this embodiment, an extension direction of the auxiliary positive electrodes 102 on the light-receiving surface, an extension direction of the auxiliary negative electrodes 103 on the light-receiving surface, an extension direction of the positive electrodes 112 on the back surface and an extension direction of the negative electrodes 113 on the back surface are parallel to guarantee stability of electrical connection of a solar cell module formed later. In another embodiment, it may be arranged that the extension direction of the auxiliary positive electrodes 102 on the light-receiving surface and the extension direction of the auxiliary negative electrodes 103 on the light-receiving surface are parallel, the extension direction of the positive electrodes 112 on the back surface and the extension direction of the negative electrodes 113 on the back surface are parallel, but the extension direction of the auxiliary positive electrodes 102 on the light-receiving surface and the extension direction of the positive electrodes 112 on the back surface are not parallel, as long as it is guaranteed that the auxiliary positive electrodes 102 and the positive electrodes 112 are electrically connected; the auxiliary negative electrodes 103 and the negative electrodes 113 are electrically connected.

Compared with existing technologies, in this embodiment, positive electrodes and negative electrodes on the back surface of the back-contact solar cell are both extended to a light-receiving surface, thereby a connecting region that may be electrically connected to a conventional back-contact solar cell is produced. Compared with the conventional back-contact solar cell, a solar cell with auxiliary electrodes extends electrodes to the light-receiving surface, and a back-contact solar cell module may be formed via overlapping or seaming, and the back-contact solar cell module has a larger light-receiving area.

In an embodiment, the present disclosure provides a back-contact solar cell with auxiliary electrodes. The auxiliary positive electrodes and the auxiliary negative electrodes are further formed at a side surface of a connecting region.

Figure 4:
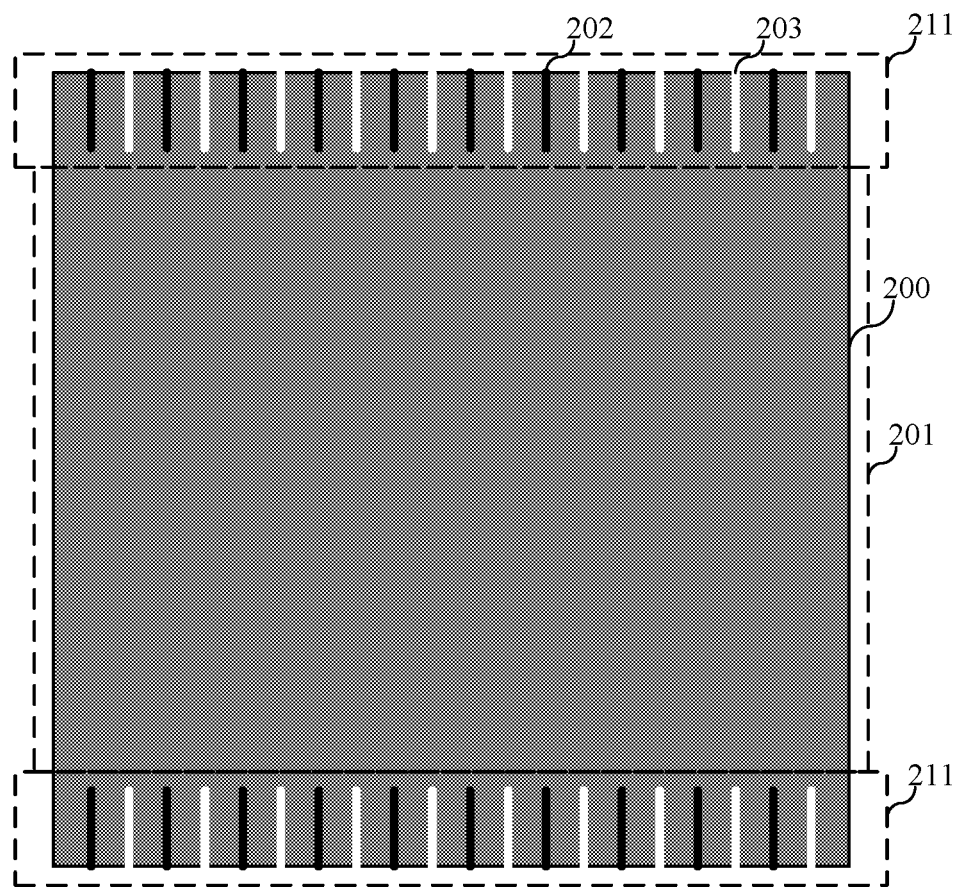
FIGS. 4 to 6 are schematic diagrams of structures of a back-contact solar cell with auxiliary electrodes according to the present disclosure.
Figure 5:
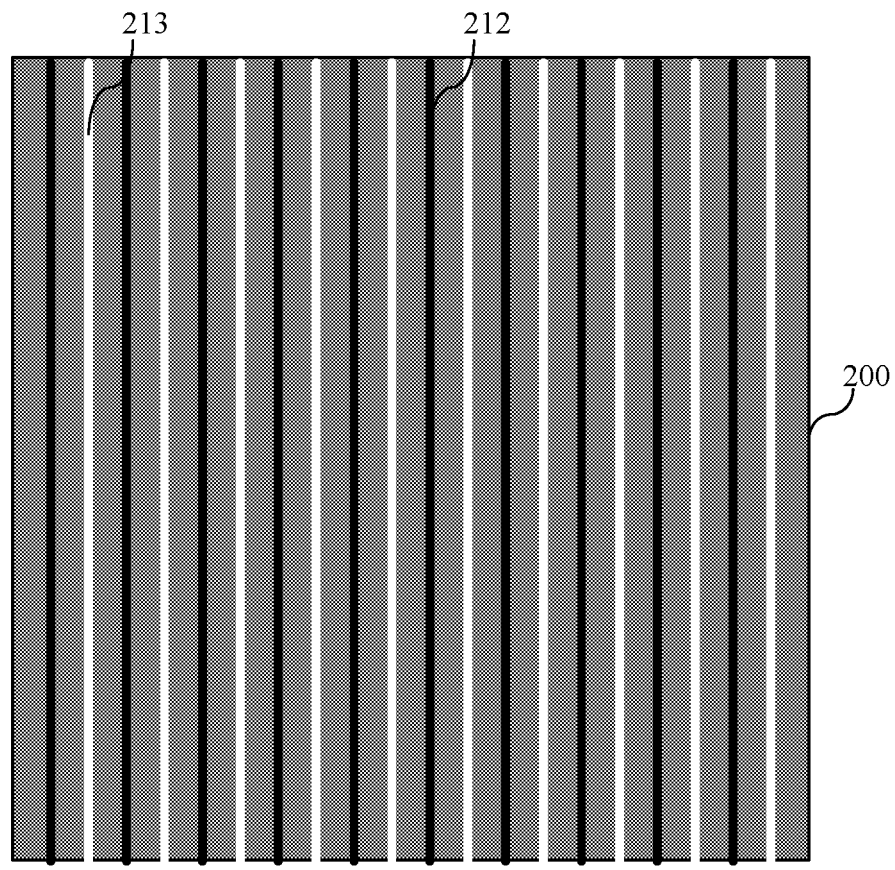
Figure 6:
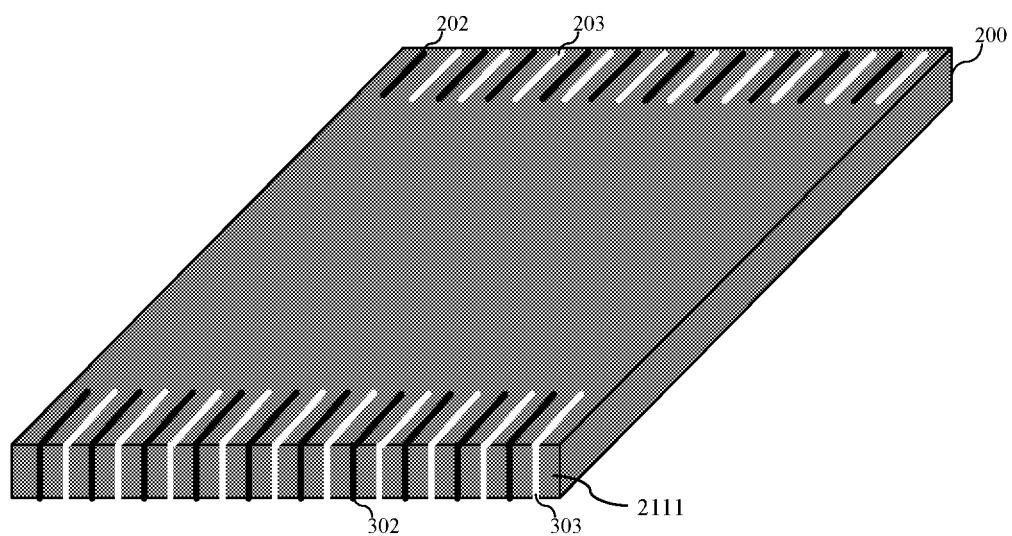

FIGS. 4 to 6 are schematic diagrams of structures of a back-contact solar cell with auxiliary electrodes provided in this embodiment. The back-contact solar cell with the auxiliary electrodes provided in this embodiment will be described in detail with reference to the drawings.

With reference to FIGS. 4 to 6, a back-contact solar cell 200 with the auxiliary electrodes includes: a substrate including a light-receiving surface facing the sun and a back surface opposite to the light-receiving surface.

In particular, the substrate at least includes a substrate having an emitter, a passivation layer and/or an anti-reflection layer disposed on a surface of the substrate. The substrate having the emitter is used to receive light radiation and generate photon-generated carriers. The passivation layer includes an interface passivation layer and/or a field passivation layer. The interaface pasivation layer is used to realize an interface passivation effect, i.e., to reduce a recombination rate of majority carriers and minority carriers. The field passivation layer is used to realize a field passivation effect, i.e., to realize selective transmission of the majority carriers to ensure effective transmission of the majority carriers. The anti-reflection layer is used to reduce reflection of light and increase a light transmission rate, thereby increasing light received by the substrate.

For the back-contact solar cell, a common passivation layer structure may be a tunnel oxide layer, a polysilicon-doped layer (a polysilicon-doped layer of a P type and an N type arranged alternately) or a silicon-nitride-with-hydrogen layer. An electrical connection is formed between a P-type polysilicon layer and a positive electrode on a back surface of the substrate, and an electrical connection is formed between an N-type polysilicon layer and a negative electrode on the back surface of the substrate.

In this embodiment, FIG. 4 shows a structure of a light-receiving surface of the back-contact solar cell 200 with the auxiliary electrodes, and FIG. 5 shows a structure of a back surface of the back-contact solar cell 200 with the auxiliary electrodes.

In a direction perpendicular to a thickness direction of the substrate, the substrate includes a center region 201 and connecting regions 211 located at opposite sides of the center region 201.

In this embodiment, the substrate is divided into the center region 201 and the connecting regions 211. The center region 201 refers to a center region to generate photon-generated carriers, for example, a central zone of the substrate. Generally, the light-receiving surface in the center region 201 does not include a metal grid line to prevent an incident light. The connecting regions 211 may refer to a region outside the center region 201, for example, two sides of the substrate. In this embodiment, a light-receiving surface of the connecting region 211 is provided with metal grid lines of auxiliary positive electrodes 202 and auxiliary negative electrodes 203.

It shall be noted that the connecting regions 211 may also receive incident light on a surface of the connecting regions 211 to generate photon-generated carriers. However, because of shielding by the grid line, there will be a certain loss in light use, causing a negative impact on light conversion efficiency. In one example, for a module formed with overlapped back-contact solar cells 200 with the auxiliary electrodes, at least a part of the connecting regions 211 will be in an overlapped region of adjacent cells in the module.

In this embodiment, each of the connecting regions 211 is a region with a width of 0.1 mm-3 mm, for example, 0.5 mm, 1.0 mm, 1.5 mm, 2.0 mm or 2.5 mm, formed at both sides of the center region 201. If a width of the connecting region 211 is too large, a light-receiving area of a solar cell module formed by overlapped cells will be reduced. If the width of the connecting region 211 is too small, stability of the solar cell module formed by the overlapped cells will be reduced.

Positive electrodes 212 are disposed on the back surface of the substrate. Negative electrodes 213 are disposed on the back surface of the substrate. Positive electrodes 212 and negative electrodes 213 are arranged alternately. In one example, positive electrode pastes and negative electrode pastes are printed on the back surface of the solar cell, and are dried to form the positive electrodes 212 and the negative electrodes 213 respectively.

In this embodiment, the auxiliary positive electrodes 202 are disposed on the light-receiving surface and the side surface 2111 of the connecting region 211, and are electrically connected to the positive electrodes 212 respectively; the auxiliary negative electrodes 203 are disposed on the light-receiving surface and the side surface 2111 of the connecting region 211, and are electrically connected to the negative electrodes 213 respectively. Auxiliary positive electrodes 202 and auxiliary negative electrodes 203 are arranged alternately. In one example, positive electrode pastes and negative electrode pastes are printed on the light-receiving surface and the side surface 2111 of the connecting regions 211 of the solar cell, and are dried to form the auxiliary positive electrodes 202 and the auxiliary negative electrodes 203.

In this embodiment, in a width direction of the connecting region 211, the auxiliary positive electrodes 202 and the auxiliary negative electrodes 203 extend from one side of the connecting region 211 to the other side of the connecting region 211.

The auxiliary positive electrodes 202 are used to extend the positive electrodes 212 from the back surface to the light-receiving surface of the connecting regions 211, and the auxiliary negative electrodes 203 are used to extend the negative electrodes 213 from the back surface to the light-receiving surface of the connecting regions 211. By extending metal grid lines of the back-contact solar cell to the light-receiving surface, the formed solar cell may be compatible for a highly-efficiency module with shingled cells/stitch welding technology. In addition, by extending the metal grid lines to the light-receiving surface, no extra shading loss is caused, thereby a high output power of the back-contact solar cell is guaranteed.

In addition, in this embodiment, an extension direction of the auxiliary positive electrodes 202 on the light-receiving surface, an extension direction of the auxiliary negative electrodes 203 on the light-receiving surface, an extension direction of the positive electrodes 212 on the back surface and an extension direction of the negative electrodes 213 on the back surface are parallel to guarantee stability of electrical connection of a solar cell module formed later. In another embodiment, it may be arranged that the extension direction of the auxiliary positive electrodes 202 on the light-receiving surface and the extension direction of the auxiliary negative electrodes 203 on the light-receiving surface are parallel, the extension direction of the positive electrodes 212 on the back surface and the extension direction of the negative electrodes 213 on the back surface are parallel, but the extension direction of the auxiliary positive electrodes 202 on the light-receiving surface and the extension direction of the positive electrodes 212 on the back surface are not parallel, as long as it is guaranteed that the auxiliary positive electrodes 202 and the positive electrodes 212 are electrically connected respectively, and the auxiliary negative electrodes 203 and the negative electrodes 213 are electrically connected respectively.

Compared with existing technologies, in this embodiment, positive electrodes and negative electrodes on the back surface of the back-contact solar cell are extended to the light-receiving surface; thereby a connecting region that may be electrically connected to a conventional back-contact solar cell is produced. Compared with the conventional back-contact solar cell, electrodes of a back-contact solar cell with auxiliary electrodes are extended to the light-receiving surface, and a back-contact solar cell module may be formed via overlapping or seaming, and the back-contact solar cell module has a larger light-receiving area.

In an embodiment, the present disclosure provides a back-contact solar cell with auxiliary electrodes, where the auxiliary electrodes are only formed on a side surface of the connecting region.

Figure 7:
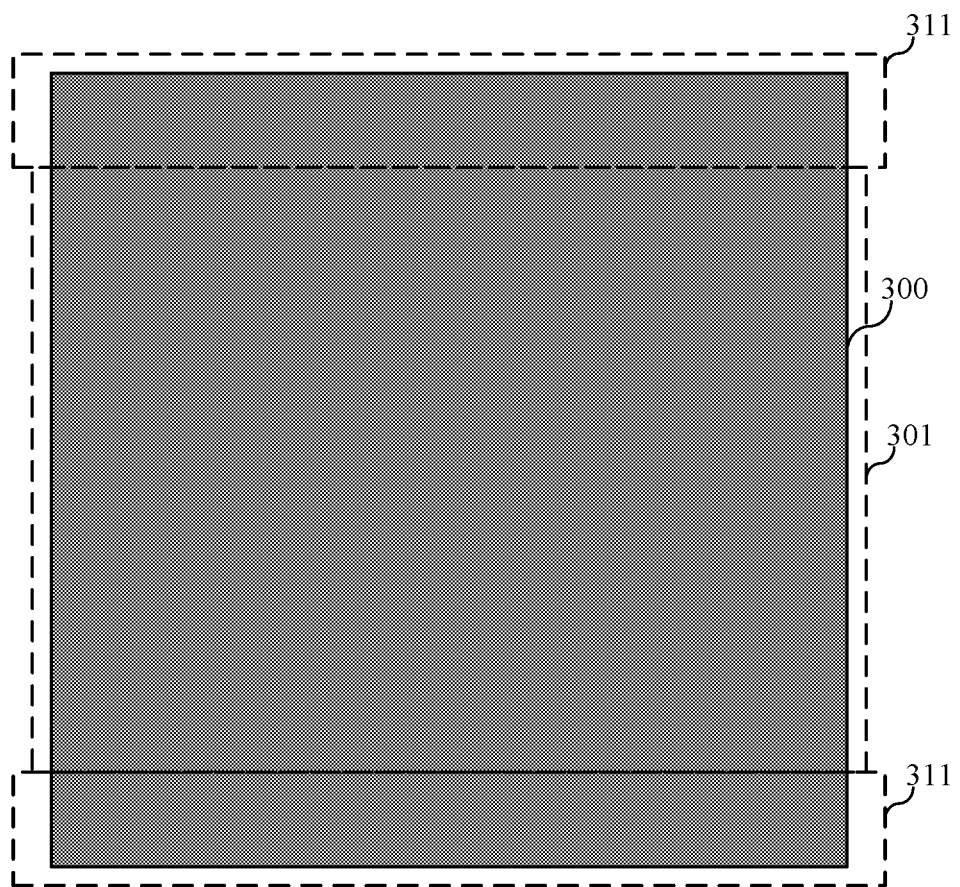
FIGS. 7 to 9 are schematic diagrams of structures of a back-contact solar cell with auxiliary electrodes according to the present disclosure.
Figure 8:
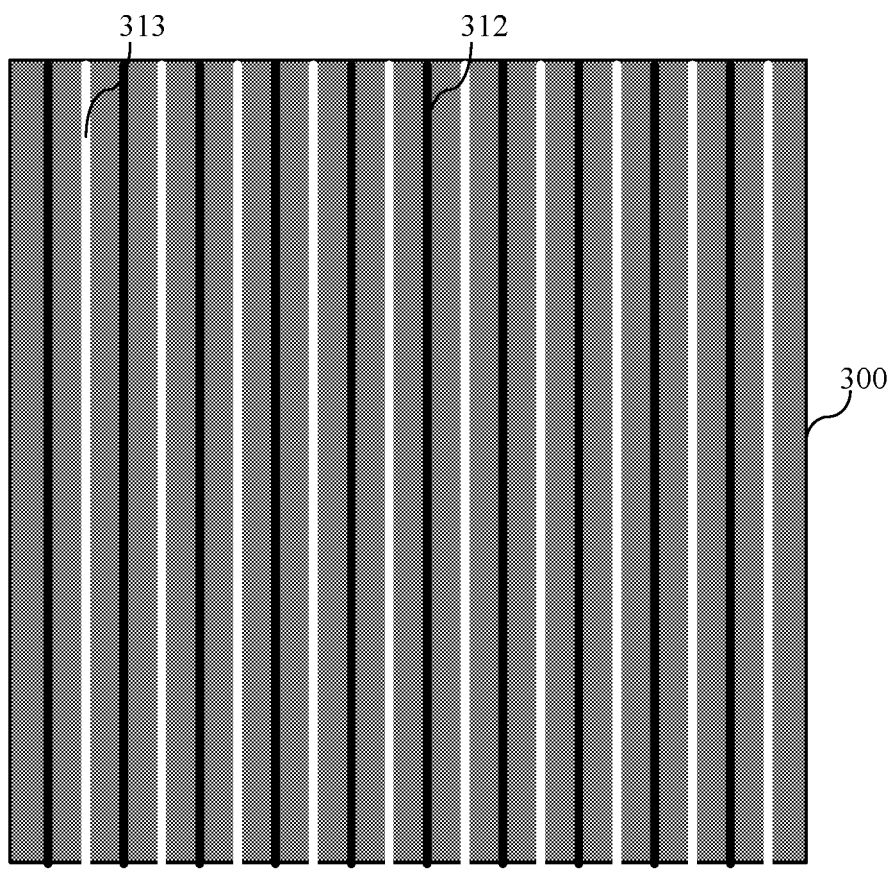
Figure 9:
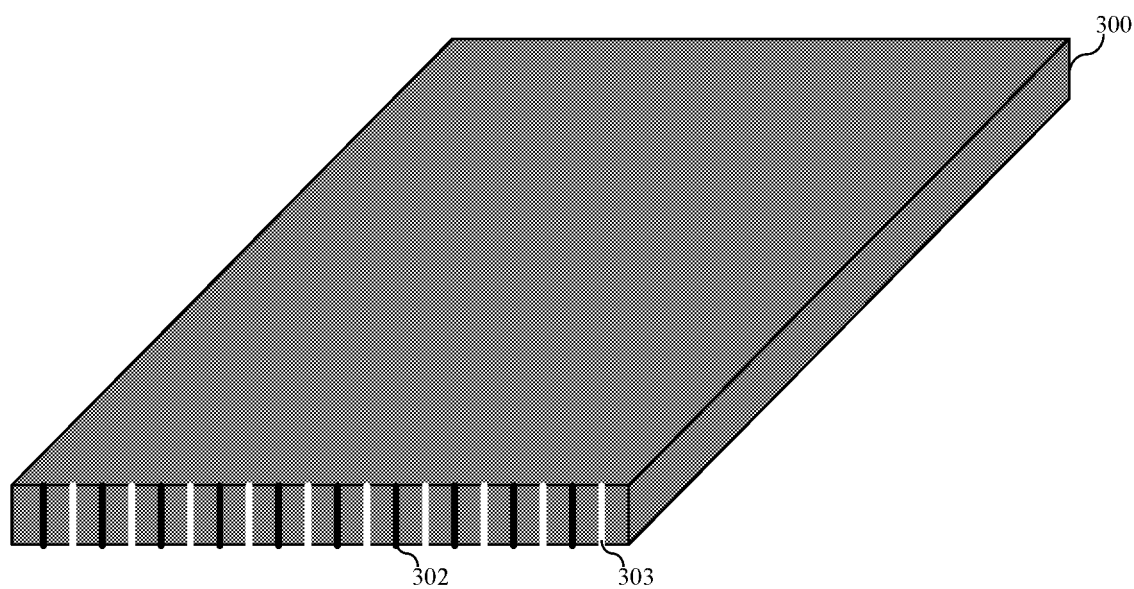

FIGS. 7 to 9 are schematic diagrams of structures of a back-contact solar cell with auxiliary electrodes provided in this embodiment. The back-contact solar cell with the auxiliary electrodes provided in this embodiment will be described in detail with reference to the drawings.

With reference to FIGS. 7 to 9, a back-contact solar cell 300 with the auxiliary electrodes includes: a substrate including a light-receiving surface facing the sun and a back surface opposite to the light-receiving surface.

In particular, the substrate at least includes a substrate having an emitter, a passivation layer and/or an anti-reflection layer disposed on a surface of the substrate. The substrate having the emitter is used to receive light radiation and generate photon-generated carriers. The passivation layer includes an interface passivation layer and/or a field passivation layer. The interaface pasiviation layer is used to realize an interface passivation effect, i.e., to reduce a recombination rate of majority carriers and minority carriers. The field passivation layer is used to realize a field passivation effect, i.e., to realize selective transmission of the majority carriers to ensure effective transmission of the majority carriers. The anti-reflection layer is used to reduce reflection of light and increase a light transmission rate, thereby increasing light radiation received by the substrate.

In this embodiment, FIG. 7 shows a structure of a light-receiving surface of the back-contact solar cell 300 with the auxiliary electrodes, and FIG. 8 shows a structure of a back surface of the back-contact solar cell 300 with the auxiliary electrodes.

In a direction perpendicular to a thickness direction of the substrate, the substrate includes a center region 301 and connecting regions 311 formed at opposite sides of the center region 301.

In this embodiment, the substrate is divided into the center region 301 and the connecting region 311. The center region 301 refers to a center region to generate photon-generated carriers, for example, a central zone of the substrate. Generally, the light-receiving surface in the center region 301 does not include a metal grid line to prevent an incident light. The connecting regions 311 may refer to a region outside the center region 301, for example, two sides of the substrate. In this embodiment, a light-receiving surface of the connecting region 311 is provided with metal grid lines of auxiliary positive electrodes 302 and auxiliary negative electrodes 303.

It shall be noted that in this embodiment, the light-receiving surface in the connecting region 311 does not include a metal grid line and is also used to receive incident light on a surface of the connecting region 311 to generate photon-generated carriers. In one example, back-contact solar cells 300 with auxiliary electrodes are overlapped to form a module, and there is no shielding on the surface of the connecting region 311.

Positive electrodes 312 are disposed on the back surface of the substrate. Negative electrodes 313 are disposed on the back surface of the substrate. Positive electrodes 312 and negative electrodes 313 are arranged alternately. In one example, positive electrode pastes and negative electrode pastes are printed on the back surface of the solar cell, and are dried to form the positive electrodes 312 and the negative electrodes 313 respectively.

In this embodiment, the auxiliary positive electrodes 302 are disposed on the side surface 311-1 of the connecting region 311, and the auxiliary negative electrodes 303 are disposed on the side surface 311-1 of the connecting region 311. Auxiliary positive electrodes 302 and auxiliary negative electrodes 303 are arranged alternately.

In particular, the auxiliary positive electrode includes a first portion 302 and a second portion (not illustrated); the auxiliary negative electrode includes a first portion 303 and a second portion (not illustrated).

The first portion of the auxiliary positive electrode 302 is formed on the side surface 311-1 of the connecting region 311; the second portion of the auxiliary positive electrode (not illustrated) is used to electrically connect the first portion of the auxiliary positive electrode 302 and the positive electrode 312. In particular, the second portion of the auxiliary positive electrode (not illustrated) is used to electrically connect the first portion of the auxiliary positive electrode 302 disposed on the side surface 311-1 of the connecting region 311 and the positive electrode 312 disposed on the back surface of the connecting region 311. The first portion of the auxiliary negative electrode 303 is disposed on the side surface 311-1 of the connecting region 311; the second portion of the auxiliary negative electrode (not illustrated) is used to electrically connect the first portion of the auxiliary negative electrode 303 and the negative electrode 313. In particular, the second portion of the auxiliary negative electrode (not illustrated) is used to electrically connect the second portion of the auxiliary negative electrode 303 disposed on the side surface 311-1 of the connecting region 311 and the negative electrode 313 disposed on the back surface of the connecting region 311.

Compared with related technologies, in this embodiment, by extending positive electrodes and negative electrodes of the back-contact solar cell from the back surface to the side surface and subsequently seaming side surface electrodes of back-contact solar cells with the auxiliary electrodes, a solar cell module without any shielding is formed.

In an embodiment, the present disclosure provides a solar cell module, including a plurality of back-contact solar cells with auxiliary electrodes (herein referred to as first back-contact solar cells) and a plurality of conventional back-contact solar cells without auxiliary electrodes (herein referred to as second back-contact solar cells). The auxiliary electrodes of the first back-contact solar cell are disposed on the light-receiving surface or both of the light-receiving surface and the side surface of the connecting region as mentioned above. The connecting region of the first back-contact solar cell is partially overlapped with the second back-contact solar cell for electrical connection. The first back-contact solar cells are spaced apart, positive electrodes of a second back-contact solar cell are electrically connected to auxiliary positive electrodes of an adjacent first back-contact solar cell respectively, and negative electrodes of the second back-contact solar cell are electrically connected to auxiliary negative electrodes of an adjacent first back-contact solar cell respectively.

Figure 12:
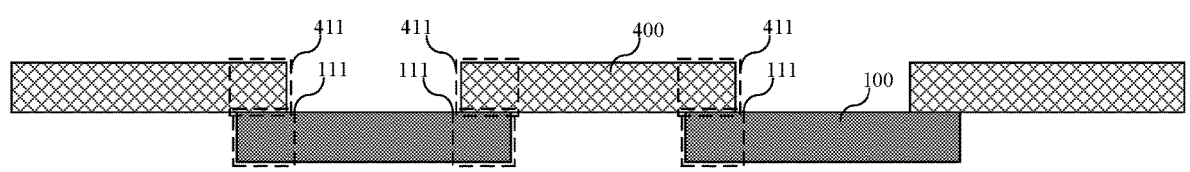
FIG. 12 is a schematic diagram of a structure of the solar cell module according to the present disclosure.

FIG. 12 is a schematic diagram of a structure of the solar cell module provided in this embodiment. In the following, the solar cell module provided in this embodiment will be described in detail with reference to the drawings.

Figure 10:
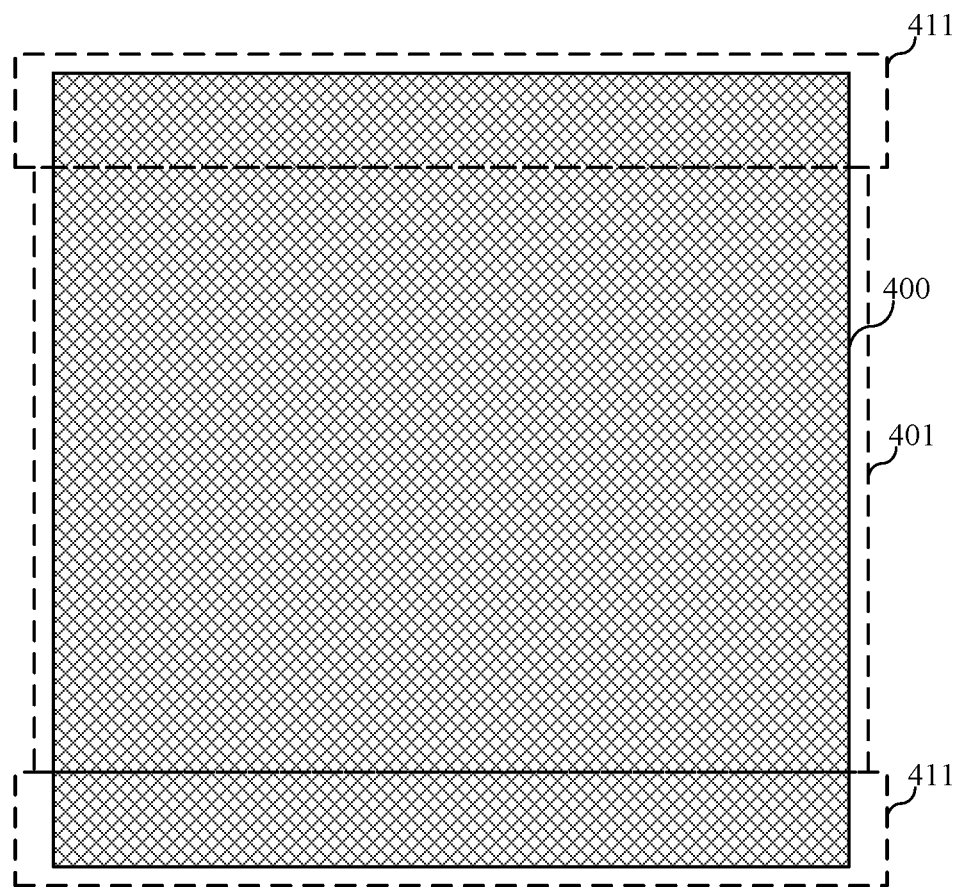
FIGS. 10 and 11 are schematic diagrams of structures of an existing back-contact solar cell according to the present disclosure.
Figure 11:
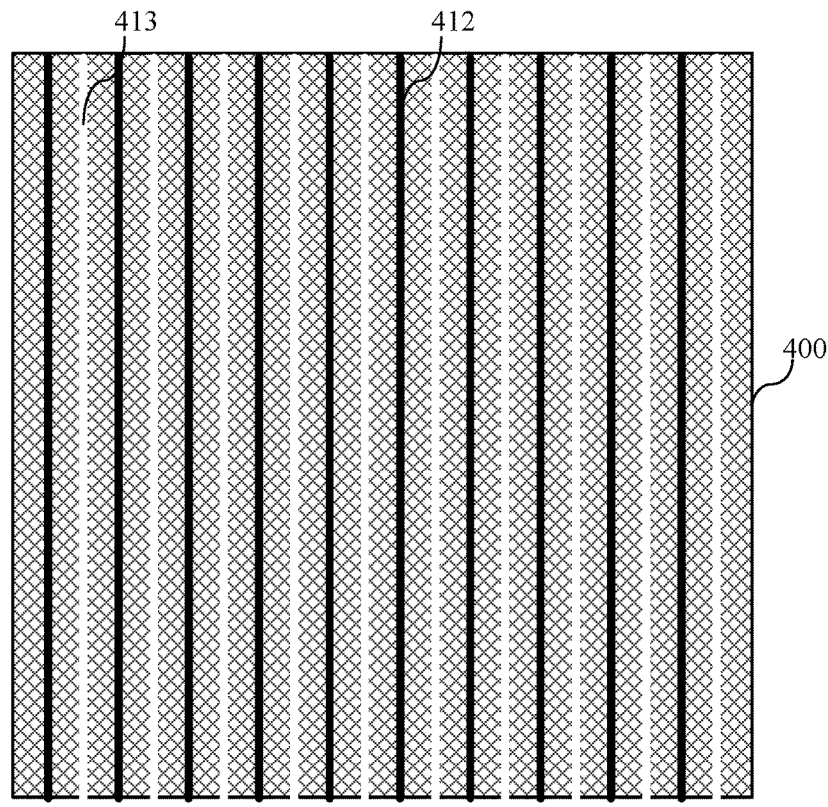

With reference to FIG. 10 and FIG. 11, a second back-contact solar cell 400 includes: a substrate including a light-receiving surface facing the sun and a back surface opposite to the light-receiving surface. In particular, the substrate at least includes a substrate having an emitter, a passivation layer and/or an anti-reflection layer disposed on a surface of the substrate. The substrate having the emitter is used to receive light radiation and generate photon-generated carriers. The passivation layer includes an interface passivation layer and/or a field passivation layer. The interface pasiviation layer is used to realize an interface passivation effect, i.e., to reduce a recombination rate of majority carriers and minority carriers. The field passivation layer is used to realize a field passivation effect, i.e., to realize selective transmission of the majority carriers to ensure effective transmission of the majority carriers. The anti-reflection layer is used to reduce reflection of light and increase a light transmission rate, thereby increasing light radiation received by the substrate. In a direction perpendicular to a thickness direction of the substrate, the substrate includes a first region 401 and second regions 411 located at opposite sides of the center region 401. In this embodiment, FIG. 10 shows a structure of a light-receiving surface of the second back-contact solar cell 400, and FIG. 11 shows a structure of a back surface of the second back-contact solar cell 400. Positive electrodes 412 are disposed on the back surface of the substrate, and negative electrodes 413 are disposed on the back surface of the substrate. Positive electrodes 412 and negative electrodes 413 are arranged alternately.

With reference to FIG. 12, this embodiment will be particularly described with the back-contact solar cell 100 with the auxiliary electrodes as an example. The connecting regions 111 of the first back-contact solar cell 100 are partially overlapped with the second back-contact solar cells 400 for electrical connection; and the first back-contact solar cells 100 are spaced apart, positive electrodes 412 of a second back-contact solar cell 400 are electrically connected to auxiliary positive electrodes 102 of an adjacent first back-contact solar cell 100 respectively, and negative electrodes 413 of the second back-contact solar cell 400 are electrically connected to auxiliary negative electrodes 103 of an adjacent first back-contact solar cell 100.

The second back-contact solar cells 400 and the first back-contact solar cells 100 that are arranged alternately share an overlapped region. The overlapped region is a part of the back surface of the second region 411 of the second back-contact solar cells 400 and a part of the light-receiving surface of the connecting region 111 of the adjacent first back-contact solar cell 100.

In this embodiment, the auxiliary positive electrodes 102, the auxiliary negative electrodes 103, the positive electrodes 412 and the negative electrodes 413 in the overlapped region are operably connected together (e.g., in a sintered manner) to form the solar cell module provided in this embodiment. In this embodiment, a sintering temperature is 500° C.~800° C., for example, 600° C. or 700° C. A temperature within this temperature range in a sintering process is not too high, thereby heat damage by the sintering process to the formed solar cell module may be prevented.

In addition, in order to guarantee stability of the formed solar cell module, the overlapped region may be coated with an adhesive, and the auxiliary positive electrodes 102, the auxiliary negative electrodes 103, the positive electrodes 412 and the negative electrodes 413 and the adhesive may be operably connected together, e.g., in a sintered manner. In one example, the adhesive may at least include one of $SiO_2$, $B_2O_3$, $Bi_2O_3$ and ZnO, and a thermal expansion coefficient of the adhesive may be similar with a thermal expansion coefficient of the substrate of the solar cell, so as to avoid cracking caused by a difference in thermal expansion coefficient after sintering.

In one example, the adhesive is a conductive adhesive, for example, a transparent conductive adhesive. The conductive adhesive may guarantee good electrical connection between adjacent cells.

In this embodiment, the solar cell module formed by combining the second back-contact solar cell 400 with the first back-contact solar cell 100 provided in the present disclosure significantly reduces cost and the solar cell module has a larger light-receiving area. In addition, the one-step sintering simplifies a production process and reduces cost of the solar cell module.

Compared with existing technologies, by electrically connecting the first back-contact solar cell with the auxiliary positive electrodes and the auxiliary negative electrodes to the positive electrodes and the negative electrodes of a back surface of a second back-contact solar cell respectively, and through a solar cell formed by combining the first back-contact solar cell and the second back-contact solar cell, it is sufficient as long as some first solar cells are formed, which greatly saves manufacturing cost of the solar cell module. In addition, by realizing electrical connection between the first back-contact solar cell and the second back-contact solar cell through the connecting regions, a process of overlapping a plurality of back-contact solar cells and a structure thereof are optimized while a light-receiving area is larger.

In an embodiment, the present disclosure provides a solar cell module including back-contact solar cells with auxiliary electrodes, and the auxiliary electrodes are disposed on side surfaces of the connecting region as mentioned above. In the solar cell module, the back-contact solar cells with auxiliary electrodes are arranged successively, side surfaces of connecting regions of adjacent back-contact solar cells with auxiliary electrodes are attached together, auxiliary positive electrodes of adjacent back-contact solar cells with the auxiliary electrodes are electrically connected, and auxiliary negative electrodes of the adjacent back-contact solar cells with auxiliary electrodes are electrically connected.

Figure 13:
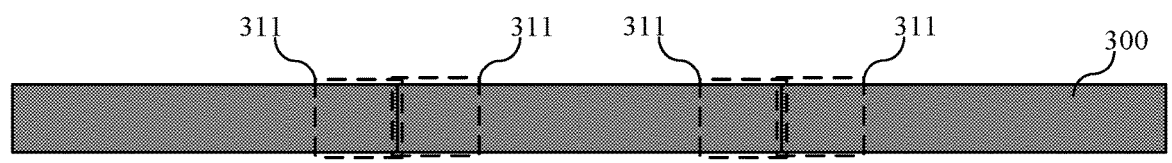
FIG. 13 is a schematic diagram of a structure of a solar cell module according to the present disclosure.

FIG. 13 is a schematic diagram of a structure of a solar cell module provided in this embodiment. In the following, the solar cell module provided in this embodiment will be described in detail with reference to the drawings.

With reference to FIG. 13, this embodiment will be particularly described with the back-contact solar cell 300 with auxiliary electrodes as an example. The back-contact solar cells 300 with auxiliary electrodes are arranged successively, side surfaces of connecting regions 311 of adjacent back-contact solar cells 300 with auxiliary electrodes are attached together, auxiliary positive electrodes 321 of adjacent back-contact solar cells 300 with auxiliary electrodes are electrically connected respectively, and auxiliary negative electrodes 313 of the adjacent back-contact solar cells 300 with auxiliary electrodes are electrically connected respectively.

The back-contact solar cells 300 with auxiliary electrodes arranged successively have a contact region. The contact region is a side surface of a connecting region 311 of the back-contact solar cells 300 with auxiliary electrodes.

In this embodiment, auxiliary positive electrodes 312 and auxiliary negative electrodes 313 in the contact region are operably connected (e.g., in a sintered manner) together to form the solar cell module provided in this embodiment. In this embodiment, a sintering temperature is 500° C.~800° C., for example, 600° C. or 700° C. A temperature within this temperature range in a sintering process is not too high, thereby heat damage by the sintering process to the formed solar cell module may be prevented.

In addition, in order to guarantee stability of the formed solar cell module, the contact region may be coated with an adhesive, and the auxiliary positive electrodes 102, the auxiliary negative electrodes 103 and the adhesive may be sintered together. In one example, the adhesive may at least include one of $SiO_2$, $B_2O_3$, $Bi_2O_3$ and ZnO, and a thermal expansion coefficient of the adhesive may be similar with a thermal expansion coefficient of the substrate of the solar cell, so as to avoid cracking caused by a difference in thermal expansion coefficient after sintering.

In one example, the adhesive is a conductive adhesive, for example, a transparent conductive adhesive. The conductive adhesive may guarantee good electrical connection between adjacent cells.

In this embodiment, the solar module formed by the back-contact solar cell 300 with auxiliary electrodes by bonding provided in the present disclosure significantly increases a light-receiving area of the solar cell module. In addition, the one-step sintering simplifies a production process and reduces cost of the solar cell module.

Compared with related technologies, by bonding side surface electrodes of back-contact solar cells with auxiliary electrodes, a solar cell module almost without any shielding is formed and has the maximum light-receiving area, which further improves energy conversion efficiency of the solar cell module.

In an embodiment, the present disclosure provides a solar cell module including a plurality of back-contact solar cells with auxiliary electrodes as above mentioned, as well as a plurality of non-back-contact solar cells. Herein, the auxiliary positive electrodes of the back-contact solar cell with auxiliary electrodes and positive electrodes of an adjacent non-back-contact solar cell are electrically connected respectively through a first conductive structure, and the auxiliary negative electrodes of the back-contact solar cell with the auxiliary electrodes and negative electrodes of the adjacent non-back-contact solar cell are electrically connected respectively through a second conductive structure.

Figure 14:
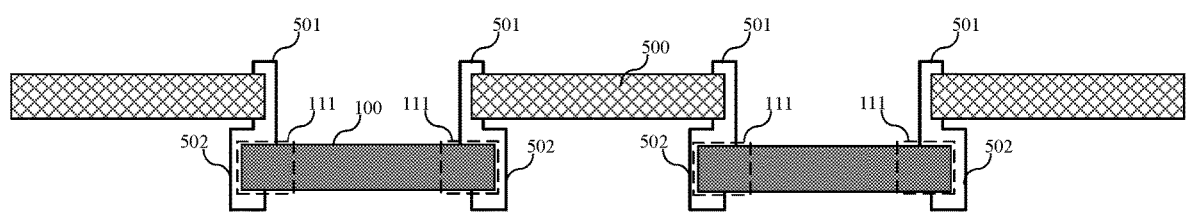
FIGS. 14 and 15 are schematic diagrams of structures of a solar cell module according to the present disclosure.
Figure 15:
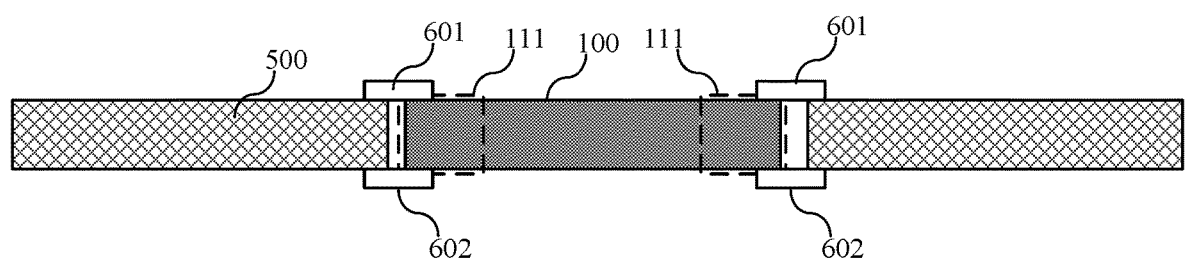

FIGS. 14 and 15 are schematic diagrams of structures of a solar cell module provided in this embodiment. In the following, the solar cell module provided in this embodiment will be described in detail with reference to the drawings.

With reference to FIG. 14, this embodiment will be particularly described with the back-contact solar cell 100 with auxiliary electrodes as an example. The auxiliary positive electrodes 102 of the back-contact solar cell 100 with auxiliary electrodes and positive electrodes of an adjacent non-back-contact solar cell 500 are electrically connected respectively through a first conductive structure 501; the auxiliary negative electrodes 103 of the back-contact solar cell 100 with auxiliary electrodes and negative electrodes of the adjacent non-back-contact solar cell 500 are electrically connected respectively through a second conductive structure 502.

In particular, the non-back-contact solar cell 500 includes but is not limited to a passivated emitter and rear cell (PERC), a tunnel oxide passivating contact (TOPCON) solar cell, a bifacial cell or the like, or a combination thereof. Both a light-receiving surface and a back surface of the non-back-contact solar cell 500 have electrodes, the electrodes of one surface being positive electrodes, while the electrodes of the other surface being negative electrodes. In this embodiment, that the light-receiving surface of the non-back-contact solar cell 500 includes the positive electrodes is taken as an example for detailed description. In another embodiment, a light-receiving surface of a non-back-contact solar cell may include negative electrodes.

In one example, the first conductive structure 501 and the second conductive structure 502 are conductive wires. The first conductive structure 501 is used to electrically connect the auxiliary positive electrode 102 of the back-contact solar cell 100 with auxiliary electrodes and the positive electrode of the non-back-contact solar cell 500; the second conductive structure 502 is used to electrically connect the auxiliary negative electrode 103 of the back-contact solar cell 100 with auxiliary electrodes and the negative electrode of the non-back-contact solar cell 500.

In another example, with reference to FIG. 15, a first conductive structure and a second conductive structure are implemented through a welding ribbon. A first welding ribbon 601 is used to electrically connect the auxiliary positive electrode 102 of the back-contact solar cell 100 with auxiliary electrodes and the positive electrode of the non-back-contact solar cell 500, and a second welding ribbon 602 is used to electrically connect the auxiliary negative electrode 103 of the back-contact solar cell 100 with auxiliary electrodes and the negative electrode of the non-back-contact solar cell 500.

It shall be noted that in this embodiment, a location relationship between the back-contact solar cell 100 with auxiliary electrodes and the non-back-contact solar cell 500 is only an example for description to facilitate learning by those skilled in the art about implementation of the solar cell module, but does not constitute a limitation to this embodiment. In practice, those skilled in the art may set a location relationship between the back-contact solar cell 100 with auxiliary electrodes and the non-back-contact solar cell 500 according to a particular need.

Compared with related technologies, this embodiment forms the solar cell module through the back-contact solar cell with auxiliary electrodes and the non-back-contact solar cell. This method, compared with forming a solar cell module by non-back-contact solar cells, increases a light-receiving area of the solar cell module, thereby energy conversion efficiency of the solar cell module is improved.

Those skilled in the art may appreciate that the above embodiments are particular embodiments to implement the present disclosure. In practice, the embodiments may be varied in form and detail without departing from the spirit and scope of the present disclosure. Any one skilled in the art may make modifications and amendments within the spirit and scope of the present disclosure. Therefore, the protection scope of the present disclosure is subject to the scope defined by the claims.

What is claimed is:

1. A back-contact solar cell, comprising:
   a substrate including a light-receiving surface and a back surface opposite to the light-receiving surface; wherein the substrate has a center region and connecting regions on opposite sides of the center region;
   a plurality of positive electrodes and a plurality of negative electrodes disposed on the back surface of the substrate;
   a plurality of auxiliary positive electrodes respectively corresponding to the plurality of positive electrodes, disposed on at least one of the light-receiving surface and a side surface of each of the connecting regions, and configured to be electrically connected to the plurality of positive electrodes, wherein each of the plurality of positive electrodes is electrically connected to a respective one of the auxiliary positive electrodes; and
   a plurality of auxiliary negative electrodes respectively corresponding to the plurality of negative electrodes, disposed on at least one of the light-receiving surface and the side surface of each of the connecting regions, and configured to be electrically connected to the plurality of negative electrodes, wherein each of the plurality of negative electrodes is electrically connected to a respective one of the auxiliary negative electrodes.

2. The back-contact solar cell according to claim 1, wherein the plurality of auxiliary positive electrodes and the plurality of auxiliary negative electrodes are disposed on the light-receiving surface of each of the connecting regions, the back-contact solar cell further comprises:
   a plurality of through-holes including first through-holes and second through-holes in the connecting regions;
   a first filling electrode, in each of the first through-holes, configured to electrically connect an individual positive electrode on the back surface and an individual auxiliary positive electrodes on the light-receiving surface, respectively;
   a second filling electrode, in each of the second through-holes, configured to electrically connect an individual negative electrode on the back surface and an individual auxiliary negative electrodes on the light-receiving surface, respectively.

3. The back-contact solar cell according to claim 2, wherein the plurality of through-holes are formed at an edge of the substrate.

4. The back-contact solar cell according to claim 2, wherein each of the connecting regions has a width of 0.1 mm-3 mm in a direction parallel to an extension direction of the plurality of positive electrodes and the plurality of negative electrodes.

5. The back-contact solar cell according to claim 4, wherein, the plurality of through-holes are formed in the connecting regions and have a distance of 0.2 mm-2.5 mm to a side surface of a corresponding connecting region.

6. The back-contact solar cell according to claim 2, wherein, each of the plurality of through-holes is circle-shaped, elliptic circle-shaped or square circle-shaped.

7. The back-contact solar cell according to claim 6, wherein, each of the plurality of through-holes is formed through laser drilling.

8. The back-contact solar cell according to claim 2, wherein the plurality of auxiliary positive electrodes and the plurality of auxiliary negative electrodes extend from one side to an other side of each of the connecting regions on the receiving surface respectively, in a direction parallel to an extension direction of the plurality of positive electrodes and the plurality of negative electrodes.

9. The back-contact solar cell according to claim 1, wherein the plurality of auxiliary positive electrodes and the plurality of auxiliary negative electrodes are disposed on both of the light-receiving surface and the side surface of each of the connecting regions, and each of the connecting regions has a width of 0.1 mm-3 mm in a direction parallel to an extension direction of the plurality of positive electrodes and the plurality of negative electrodes.

10. The back-contact solar cell according to claim 9, wherein the plurality of auxiliary positive electrode and the plurality of auxiliary negative electrode extend from the light-receiving surface to the side surface of each of the connecting regions.

11. The back-contact solar cell according to claim 1, wherein an extension direction of the plurality of auxiliary positive electrodes on the light-receiving surface, an extension direction of the plurality of auxiliary negative electrodes on the light-receiving surface, an extension direction of the plurality of positive electrodes on the back surface and an extension direction of the plurality of negative electrodes on the back surface are parallel.

12. The back-contact solar cell according to claim 1, wherein the plurality of auxiliary positive electrodes and the plurality of auxiliary negative electrodes are disposed on the side surface of each of the connecting regions;
   a first portion of an individual auxiliary positive electrode is disposed on the side surface of an individual connecting region and a second portion of the individual auxiliary positive electrode is configured to electrically connect to the first portion of the individual auxiliary positive electrode and an individual positive electrode;
   a first portion of an individual auxiliary negative electrode is disposed on the side surface of an individual connecting region and a second portion of the individual auxiliary negative electrode is configured to electrically connect to the first portion of the individual auxiliary negative electrode and an individual negative electrode.

13. The back-contact solar cell according to claim 1, wherein the plurality of auxiliary positive electrodes and the plurality of auxiliary negative electrodes are arranged alternately, and are prepared by printing and drying a plurality of positive electrode pastes and a plurality of negative electrode pastes, respectively.

14. A solar cell module, comprising a plurality of first back-contact solar cells and a plurality of second back-contact solar cells;
   wherein each of the plurality of first back-contact solar cells comprises:
      a substrate including a light-receiving surface and a back surface opposite to the light-receiving surface; wherein the substrate has a center region and connecting regions on opposite sides of the center region;
      a plurality of positive electrodes and a plurality of negative electrodes disposed on the back surface of the substrate;
      a plurality of auxiliary positive electrodes respectively corresponding to the plurality of positive electrodes, disposed on the light-receiving surface or disposed on both the light-receiving surface and a side surface of each of the connecting regions, and configured to be electrically connected to the plurality of positive electrodes, wherein each of the plurality of positive electrodes is electrically connected to a respective one of the auxiliary positive electrodes; and a plurality of auxiliary negative electrodes respectively corresponding to the plurality of negative electrodes, disposed on the light-receiving surface or disposed on both the light-receiving surface and the side surface of each of the connecting regions, and configured to be electrically connected to the plurality of negative electrodes, wherein each of the plurality of negative electrodes is electrically connected to a respective one of the auxiliary negative electrodes;

wherein each of the plurality of second back-contact solar cells comprises: a plurality of positive electrodes and a plurality of negative electrodes disposed on a back surface of a substrate and no electrodes disposed on a light-receiving surface of the substrate;

wherein:
- at least one of connecting regions of an individual first back-contact solar cell is overlapped with a part of an individual second back-contact solar cell for electrical connection; and
- the plurality of first back-contact solar cells are spaced apart, the plurality of positive electrodes of each second back-contact solar cell are electrically connected to the plurality of auxiliary positive electrodes of an adjacent first back-contact solar cell respectively; and
- the plurality of negative electrodes of each second back-contact solar cell are electrically connected to the plurality of auxiliary negative electrodes of an adjacent first back-contact solar cell.

15. The solar cell module according to claim 14, wherein, an overlapped region is coated with an adhesive, for the plurality of auxiliary positive electrodes, the plurality of auxiliary negative electrodes, the plurality of positive electrodes and the plurality of negative electrodes in the overlapped region to be operably coupled together.

16. The solar cell module according to claim 15, wherein, the plurality of auxiliary positive electrodes, the plurality of auxiliary negative electrodes, the plurality of positive electrodes and the plurality of negative electrodes in the overlapped region are operably coupled together by a sintering process with a sintering temperature of 500° C.~800° C.

17. The solar cell module according to claim 15, wherein, the adhesive at least comprises one of a conductive adhesive, $SiO_2$, $B_2O_3$, $Bi_2O_3$ and ZnO.

18. A solar cell module, comprising:
a plurality of back-contact solar cells, wherein each of the plurality of back-contact solar cells comprises:
- a substrate including a light-receiving surface and a back surface opposite to the light-receiving surface;
- wherein the substrate has a center region and connecting regions on opposite sides of the center region;
- a plurality of positive electrodes and a plurality of negative electrodes disposed on the back surface of the substrate;
- a plurality of auxiliary positive electrodes respectively corresponding to the plurality of positive electrodes, disposed on a side surface of each of the connecting regions, and configured to be electrically connected to the plurality of positive electrodes, wherein each of the plurality of positive electrodes is electrically connected to a respective one of the auxiliary positive electrodes; and
- a plurality of auxiliary negative electrodes respectively corresponding to the plurality of negative electrodes, disposed on the side surface of each of the connecting regions, and configured to be electrically connected to the plurality of negative electrodes, wherein each of the plurality of negative electrodes is electrically connected to a respective one of the auxiliary negative electrodes;

wherein a first portion of an individual auxiliary positive electrode is disposed on the side surface of an individual connecting region and a second portion of the individual auxiliary positive electrode is configured to electrically connect to the first portion of the individual auxiliary positive electrode and an individual positive electrode;

a first portion of an individual auxiliary negative electrode is disposed on the side surface of an individual connecting region and a second portion of the individual auxiliary negative electrode is configured to electrically connect to the first portion of the individual auxiliary negative electrode and an individual negative electrode;

the plurality of back-contact solar cells are arranged successively, side surfaces of connecting regions of adjacent back-contact solar cells are attached together;

the plurality of auxiliary positive electrodes of the adjacent back-contact solar cells are electrically connected, and the plurality of negative electrodes of the adjacent back-contact solar cells are electrically connected.

19. The solar cell module according to claim 18, wherein, the side surfaces of connecting regions of adjacent back-contact solar cells are attached by an adhesive.

20. The solar cell module according to claim 19, wherein, the adhesive at least comprises one of a conductive adhesive, $SiO_2$, $B_2O_3$, $Bi_2O_3$ and ZnO.

* * * * *